United States Patent
Chapman

Patent Number: 5,484,485
Date of Patent: Jan. 16, 1996

[54] PLASMA REACTOR WITH MAGNET FOR PROTECTING AN ELECTROSTATIC CHUCK FROM THE PLASMA

[76] Inventor: Robert A. Chapman, 972-6 Asilomar Ter., Sunnyvale, Calif. 94086

[21] Appl. No.: 145,990

[22] Filed: Oct. 29, 1993

[51] Int. Cl.⁶ .................................................. C23C 16/00
[52] U.S. Cl. ............................ 118/723 R; 118/723 E; 156/345; 204/298.15
[58] Field of Search ........................... 118/50, 50.1, 623, 118/715, 728, 621, 500, 723 R, 723 MA, 723 E; 204/192.1, 298.15, 298.16; 156/345

[56] References Cited

U.S. PATENT DOCUMENTS

| | | |
|---|---|---|
| 4,140,943 | 2/1979 | Ehlers . |
| 5,178,739 | 1/1993 | Barnes et al. .................. 204/192.12 |
| 5,306,985 | 4/1994 | Berry . |

Primary Examiner—James C. Housel
Assistant Examiner—Jan M. Ludlow
Attorney, Agent, or Firm—Richard T. Lyon

[57] ABSTRACT

The present invention ameliorates the problem in a plasma reactor of plasma attacking an electrostatic chuck and the wafer periphery backside by placing a magnet in the quartz wall adjacent the wafer peripheral edge.

12 Claims, 2 Drawing Sheets

… (5,484,485)

PLASMA REACTOR WITH MAGNET FOR PROTECTING AN ELECTROSTATIC CHUCK FROM THE PLASMA

BACKGROUND OF THE INVENTION

1. Technical Field

The invention relates to plasma reactors having electrostatic chucks for holding a semiconductor wafer on a pedestal inside the vacuum chamber of the reactor, and in particular to a way of protecting the electrostatic chuck from corrosion and erosion by the plasma.

2. Background Art

An electrostatic chuck holds a wafer onto a pedestal inside a plasma reactor chamber using electrostatic attraction. This overcomes the problems of conventional metal clamp rings used for the same purpose, such problems including the masking of the wafer periphery by the metal ring, metal-to-semiconductor contact problems with particulate contamination and the susceptibility of the metal ring to etch damage from the plasma.

However, the electrostatic chuck itself is susceptible to etch damage from the plasma, particularly when employed in a plasma etch process. This is because the electrostatic chuck typically consists of a conductor such as a copper film covered top and bottom by an insulator film such as polyimide, which is susceptible to being removed by the plasma. In order to hold the wafer to the chuck, the copper layer is held at a high voltage (e.g., 600 volts D.C.). If the plasma removes enough polyimide insulation from the copper conductor to short the conductor to the plasma, there is insufficient electrostatic force to hold the wafer to the chuck.

Another problem is that in a typical electrostatic chuck, the wafer periphery overhangs the edge of the chuck, so that any plasma escaping beyond the edge of the wafer not only etches the electrostatic chuck, as discussed above, but also etches the backside of the wafer periphery, an undesirable effect.

The foregoing problems with the electrostatic chuck arise primarily because there must be at least a small (1–3 mm) circumferential gap between the wafer edge and the side wall of the chamber. Typically, the chamber side wall, in certain reactor types, is quartz and is consumed slowly over the course of processing many wafers to provide a material for scavenging fluorine in a plasma etch process. It is through the circumferential gap between the quartz side wall and the wafer periphery that the plasma can extend to the region behind the wafer, so as to corrosively attack the electrostatic chuck and the wafer periphery backside.

SUMMARY OF THE DISCLOSURE

The present invention ameliorates the problem of plasma attacking the electrostatic chuck and the wafer periphery backside by placing a magnet adjacent the wafer peripheral edge, preferably in or on the chamber wall. The magnetic field of the magnet is oriented so as to divert at least some of the plasma a away from the circumferential wafer-to-side wall gap, thereby at least reducing the tendency of the plasma to extend through the gap between the edge of the wafer and the wall.

DETAILED DESCRIPTION OF THE PREFERRED EMBODIMENT

Figure 1:
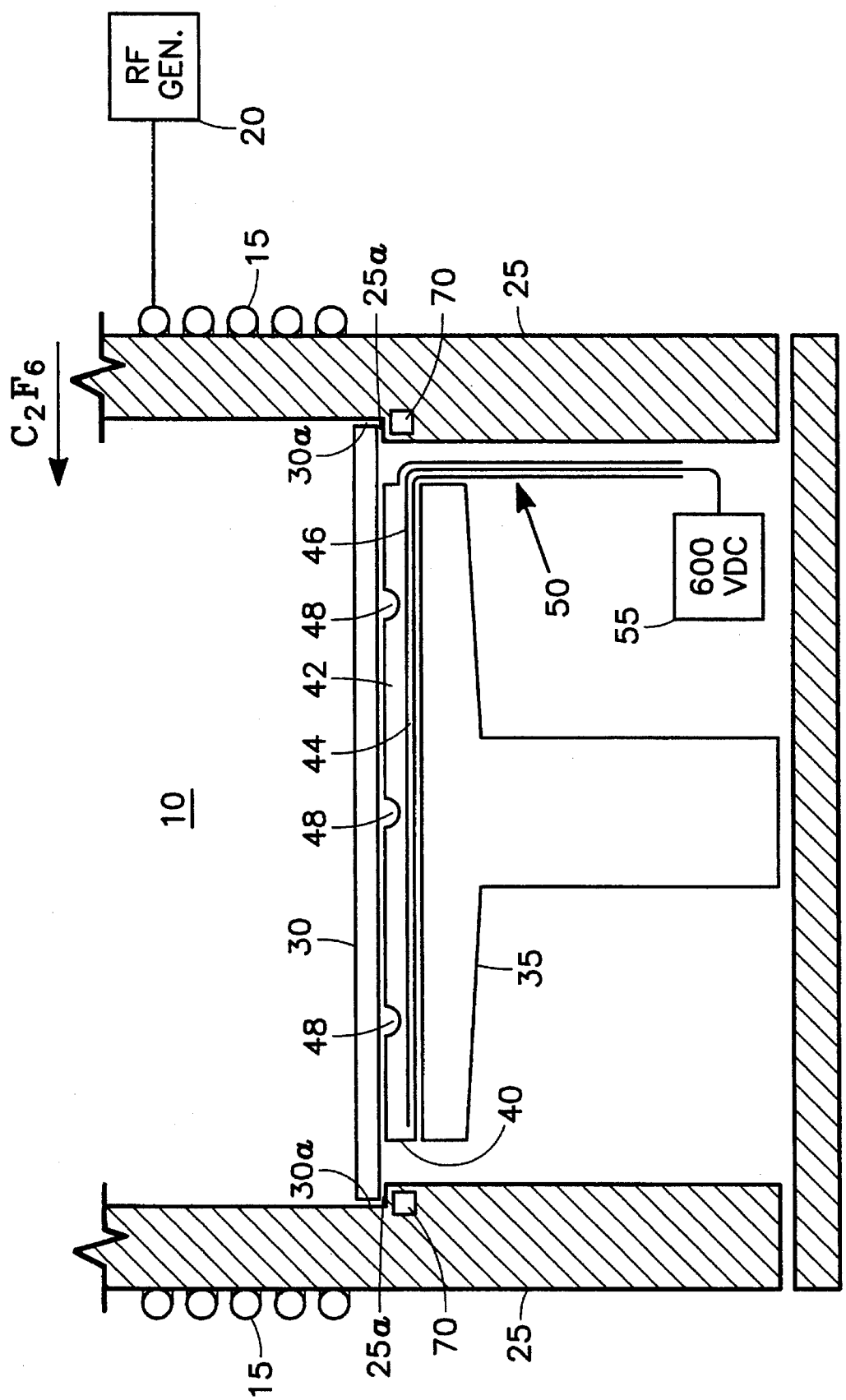
FIG. 1 is a highly simplified diagram of a portion of a plasma reactor including an electrostatic chuck holding a wafer, and illustrating a permanent ring magnet for protecting the electrostatic chuck in accordance with one embodiment of the invention.
Figure 2:
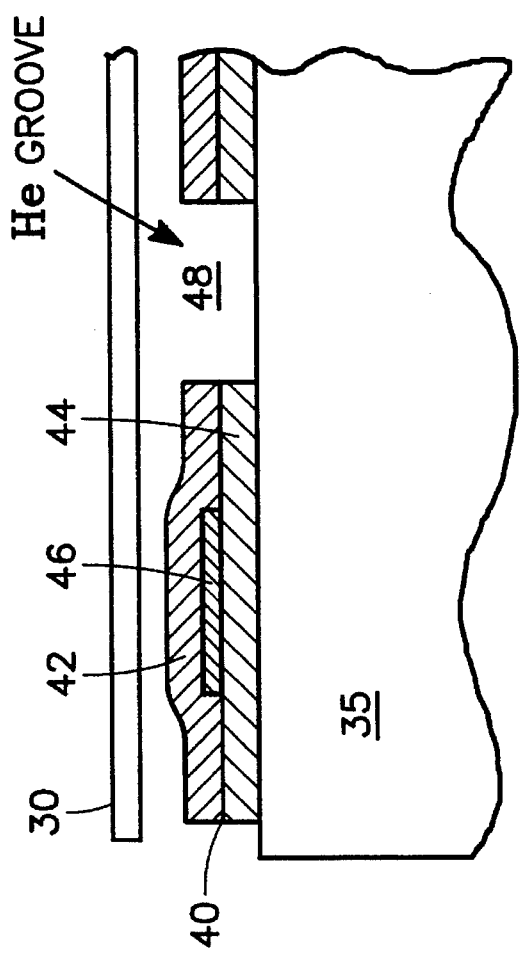
FIG. 2 is an enlarged drawing of a portion of FIG. 1 illustrating the electrostatic chuck.

Referring to FIG. 1, a conventional plasma reactor includes a vacuum chamber 10 into which precursor etchant species such as $C_2F_6$ gas is introduced through a gas inlet (not shown), which is excited into a plasma state by RF energy from an RF antenna such as the inductively coupled coil antenna 15 connected to an RF generator 20. The chamber 10 is bounded on its sides by a cylindrical quartz wall 25. A semiconductor wafer 30 having thin film structures thereon which are to be etched is firmly held on the top of a pedestal 35 by a conventional electrostatic chuck 40 best shown in partial cross-section in FIG. 2. The chuck 40 consists of polyimide sheets 42, 44 illustrated in FIG. 2, which insulate a copper film conductor 46. Coolant grooves 48 permit a coolant such as helium gas to be circulated underneath the wafer 30 to regulate the temperature thereof. The copper conductor 46 is connected via a cable 50 to a high voltage source 55.

The quartz side wall 25 has a shoulder 25a near the periphery 30a of the wafer 30 which confines much of the plasma above the wafer 30 in a first portion of the chamber. However, a clearance (in the form of a circumferential gap 60) on the order of 1–3 mm must be maintained between the wafer periphery 30a and the quartz side wall 25. This is necessary to permit efficient insertion and removal of the wafer 30 on the pedestal 35 without risking damage to the wafer edge through contact with the quartz side wall 25.

The problem is that the gap 60 permits the plasma to penetrate to the underside of the wafer to a second portion of the chamber, where it etches the polyimide insulator around the connector 50 as well as the peripheries of the polyimide insulator layers 42, 44 of the electrostatic chuck 40, and etches the backside of the wafer 30.

Figure 3:
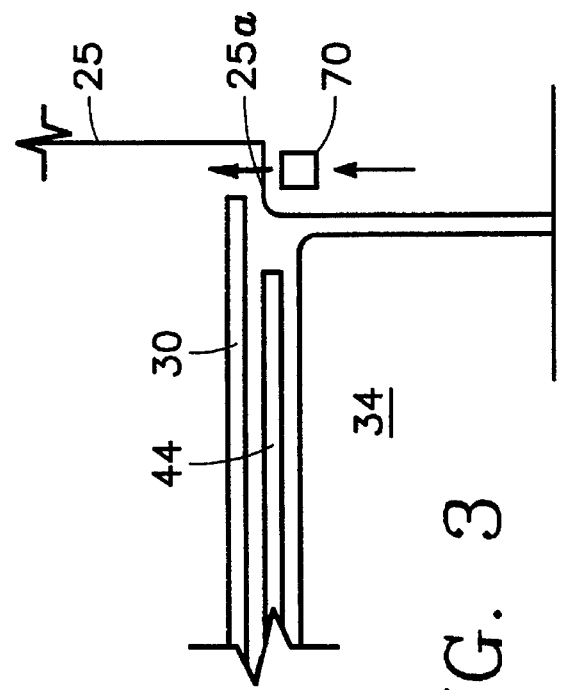
FIG. 3 is a drawing corresponding to FIG. 1 illustrating the magnetic field orientation of the permanent magnet relative to the plasma.

In order to at least reduce the rate at which plasma etches the polyimide insulation and the wafer backside, a magnet 70, preferably a permanent magnet, is placed in a ring inside the quartz side wall 25 around and near the circumferential gap 60 on substantially the same plane as the support portion of the chuck, as shown. The permanent magnet 70 has a magnetic orientation best shown in FIG. 3, in which one pole thereof (e.g., the north pole) generally faces across the gap 60, so as to deflect moving charged particles (e.g., ions, radicals and electrons) from the plasma away from the gap 60. While the skilled worker can select any suitable strength for the permanent magnet 70, any minimal strength will reduce the flow of plasma through the gap 70, thereby at least reducing the rate at which the plasma etches the polyimide insulation around the conductor 46 or connector 50 as well as the rate at which the plasma etches the backside of the wafer periphery. Such a reduction in etch rate is a significant advantage and fulfills the object of the invention.

Of course, it would be preferable to select a magnetic strength of the permanent magnet 70 along with a location of the permanent magnet relative to the gap 60 which completely prevents any penetration of the plasma through the gap 60. This, however, is not a requirement of the present invention, and is instead the subject of future development work. The placement and strength of the permanent magnet 70 to achieve such a complete cutoff of plasma diffusion through the gap 60 would depend upon the design of the plasma reactor, the plasma density near the gap, the sheath voltage near the gap and the distance between the magnet 70 and the gap 60.

While the invention has been described in detail by specific reference to preferred embodiments thereof, it is understood that variations and modifications may be made without departing from the true spirit and scope of the invention.

What is claimed is:

1. A plasma reactor for processing substrates comprising:
   a chamber;
   an electrostatic chuck having a support portion for holding a substrate, said electrostatic chuck being disposed in said chamber and dividing said chamber into first and second chamber sections located on opposite sides of said support portion;
   a source of plasma precursor species;
   a power source for generating a plasma from said plasma precursor species in said first chamber sections;
   a side wall of said chamber surrounding a periphery of the chuck with a circumferential gap between said side wall and any substrate held by the chuck; and
   a magnet disposed adjacent to said circumferential gap, said magnet having a magnetic field having a substantial component directed through the gap to inhibit impingement of plasma on surfaces of the chuck and any substrate held by the chuck which exist in said second chamber section, said magnet being disposed in substantially the same plane as the support portion of the electrostatic chuck.

2. The apparatus of claim 1 wherein said magnet resides inside a circumferential shoulder extending out from said side wall.

3. The apparatus of claim 3 wherein said side wall is a cylindrical side wall surrounding said substrate and wherein said gap is annular and wherein said shoulder is a cylindrical shoulder and wherein said magnet comprises a circular ring magnet disposed adjacent said gap inside said shoulder of said side wall.

4. The apparatus of claim 3 wherein said magnet is a permanent magnet.

5. The apparatus of claim 3 wherein said cylindrical shoulder has a top surface which is at all points thereon below a plane corresponding to the bottom surface of said substrate.

6. The apparatus of claim 5 wherein said cylindrical shoulder extends out from the side wall a distance approximately equal to a width of the circumferential gap.

7. A plasma reactor for processing substrates comprising:
   a vacuum chamber defining a circumferential side wall;
   an electrostatic chuck disposed within said chamber and surrounded by said side wall, said chuck being adapted to hold a substrate on a support portion of said chuck in a position defining a circumferential gap between said side wall and any substrate held by the chuck, said chuck dividing said chamber into first and second chamber sections located on opposite sides of said support portion;
   a source of plasma precursor species;
   a power source for generating a plasma from said plasma precursor species in said first chamber section;
   a magnet disposed adjacent to said circumferential gap, said magnet having a magnetic field having a substantial component directed through the gap to inhibit impingement of plasma on surfaces of the chuck and any substrate held by the chuck which exist in said second chamber portion, said magnet being disposed in substantially the same plane as the support portion of the electrostatic chuck.

8. The apparatus of claim 7 wherein said magnet resides inside a circumferential shoulder extending out from said circumferential side wall.

9. The apparatus of claim 8 wherein:
   said circumferential side wall is a cylindrical side wall surrounding said substrate;
   said circumferential gap is annular;
   said shoulder is a cylindrical shoulder; and
   said magnet comprises a circular ring magnet disposed adjacent said gap inside said shoulder of said side wall.

10. The apparatus of claim 9 wherein said magnet is a permanent magnet.

11. The apparatus of claim 9 wherein said cylindrical shoulder has a top surface which is at all points thereon below a plane corresponding to the bottom surface of said substrate.

12. The apparatus of claim 11 wherein said cylindrical shoulder extends out from the side wall a distance approximately equal to a width of the circumferential gap.

* * * * *